(12) United States Patent
Burkhart et al.

(10) Patent No.: US 6,469,283 B1
(45) Date of Patent: Oct. 22, 2002

(54) METHOD AND APPARATUS FOR REDUCING THERMAL GRADIENTS WITHIN A SUBSTRATE SUPPORT

(75) Inventors: Vincent E. Burkhart, San Jose; Steven Sansoni, Tracy; Michael N. Sugarman, San Francisco; Anthony Chan, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 75 days.

(21) Appl. No.: 09/262,788

(22) Filed: Mar. 4, 1999

(51) Int. Cl.$^7$ .............................. H05B 3/02; H05B 3/68
(52) U.S. Cl. ..................... 219/486; 219/444.1
(58) Field of Search ................ 219/444.1, 448.11, 219/448.12, 483, 485, 486, 490, 492, 497

(56) References Cited

U.S. PATENT DOCUMENTS

| | | | | |
|---|---|---|---|---|
| 3,627,967 A | * | 12/1971 | Bertolasi | 219/69.19 |
| 4,511,789 A | * | 4/1985 | Goessler et al. | 219/448.11 |
| 4,758,710 A | * | 7/1988 | Crossley et al. | 219/462.1 |
| 4,788,398 A | * | 11/1988 | Hornung | 219/448.12 |
| 5,059,770 A | * | 10/1991 | Mahawili | 219/444.1 |
| 5,120,936 A | * | 6/1992 | Shyu et al. | 219/497 |
| 5,151,871 A | * | 9/1992 | Matsumura et al. | 219/444.1 |
| 5,294,778 A | * | 3/1994 | Carman et al. | 219/444.1 |
| 5,396,047 A | * | 3/1995 | Schilling et al. | 219/448.11 |
| 5,438,914 A | * | 8/1995 | Hohn et al. | 219/492 |
| 5,702,624 A | * | 12/1997 | Liao et al. | 219/444.1 |
| 5,703,342 A | * | 12/1997 | Hoffmann et al. | 219/497 |
| 5,854,472 A | * | 12/1998 | Wildi | 219/549 |

* cited by examiner

Primary Examiner—Sang Paik
(74) Attorney, Agent, or Firm—Moser, Patterson & Sheridan

(57) ABSTRACT

A method and apparatus for reducing the thermal gradients within substrate support such as a ceramic wafer support pedestal. Specifically, the present invention is a heater controller that limits the amount of power that is applied to a resistive heater embedded within a ceramic pedestal. The heater controller comprises the necessary circuitry for limiting the amount of power applied to one or more zones with respect to a single other zone. Said heater controller also contains the necessary circuitry to detect faulty or misconnected wires between heater controller and the zones to be heated.

16 Claims, 6 Drawing Sheets

METHOD AND APPARATUS FOR REDUCING THERMAL GRADIENTS WITHIN A SUBSTRATE SUPPORT

BACKGROUND OF THE DISCLOSURE

1. Field of the Invention

The present invention relates to semiconductor wafer processing equipment and, more particularly, to a method and apparatus for reducing the thermal gradients in a substrate support such as a ceramic wafer support pedestal by controlling the power or current applied to a resistive heater within the pedestal.

2. Description of the Background Art

Within a process chamber of a semiconductor wafer processing system, a semiconductor wafer is typically supported by a substrate support or pedestal while being processed. In many such systems to facilitate processing of the wafer, the pedestal is heated to raise the temperature of the wafer during one or more of the process steps. To facilitate heat transfer to the wafer, the pedestal is fabricated from a ceramic material and the heater is a resistive heater element embedded in the ceramic. The heater element is generally a coil of resistive wire or a metallized layer fabricated from a material such as tungsten. When current is applied to this wire or layer, the element generates heat that is conductively transferred through the ceramic to the wafer.

The resistance of the heater element varies substantially as current is applied to the element and the temperature of the element rises. The resistance of the heater element may change by as much as a factor of three. Consequently, the power applied by the heater varies from, e.g., 2400 watts, when the element is at room temperature (relatively low resistivity of approximately 6 ohms at room temperature), to, e.g., 800 watts, when the element is at operating temperature (relatively high resistivity of approximately 18 ohms at 550° C.). Such a large amount of power applied to the heater element when it is cold produces substantial thermal gradients within the ceramic of the pedestal. Such thermal gradients tend to cause cracks in the ceramic which ultimately renders the pedestal useless.

It is common to individually test 200 mm diameter pedestals (the current industry standard) to determine if the heater element resistance value is within an appropriate operating range. For instance, if the resistance value is too low, the power transmitted to the pedestal will exceed the 10 amp limit of the processing system's capabilities. If the resistance value is too high, the power applied to the pedestal will not be sufficient to elevate pedestal temperature to the desired operating region (approximately 550° C.). The next generation wafers and their corresponding pedestal assemblies will be on the order of 300 mm diameter. The increased size of such pedestals makes the heater resistance tolerances even more difficult to control. For example, radiative heat losses at the edges of a 300 mm pedestal must be compensated for on a much greater scale than in a corresponding 200 mm pedestal so as to ensure proper processing and adequate yield of a 300 mm wafer.

Therefore, there is a need in the art for a method and apparatus for reducing the thermal gradients in a ceramic pedestal and compensating for radiative heat losses of larger (300 mm) pedestals by controlling the amount of power or current applied to a resistive heater within a ceramic pedestal.

SUMMARY OF THE INVENTION

The disadvantages heretofore associated with the prior art are overcome by the present invention of a method and apparatus for reducing the thermal gradients in a ceramic pedestal. Specifically, the present invention is a heater controller that limits the amount of power or current that is applied to one or more coils of a resistive heater in said pedestal. The heater controller further comprises a zone control module having zone proportional control circuitry for controlling the amount of power provided to one or more zones within the pedestal, each of said one or more zones corresponding to said one or more coils. The apparatus also has a phase angle control module equipped with a wire detection circuit. The wire detection circuit detects the condition of power transmission between the heater controller and the heater.

The subject invention further includes a method of reducing thermal gradients within a substrate support pedestal having one or more zones. The steps of this method are (a) applying an equal amount of power to all of said one or more zones for uniform thermal ramp up of said substrate support pedestal; (b) performing a check of power levels transmitted to said one or more zones; (c) allowing thermal ramp up of the substrate support pedestal to reach a predetermined set point; and (d) upon reaching said set point, maintaining the original amount of power to one of said one or more zones and applying proportionately less power to at least one of the remaining of said zones. In a preferred embodiment of the invention, 100% power is applied to a first outer zone of the substrate support pedestal and 50% of said power is applied to a second inner zone of said substrate support pedestal. The method and apparatus disclosed herein provide for greater control and extended life of a ceramic substrate support such as an electrostatic chuck used for semiconductor wafer processing in a process chamber. The uniform thermal ramp up reduces the likelihood of cracking the ceramic material and the zoned control compensates for heat losses that occur during wafer processing.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
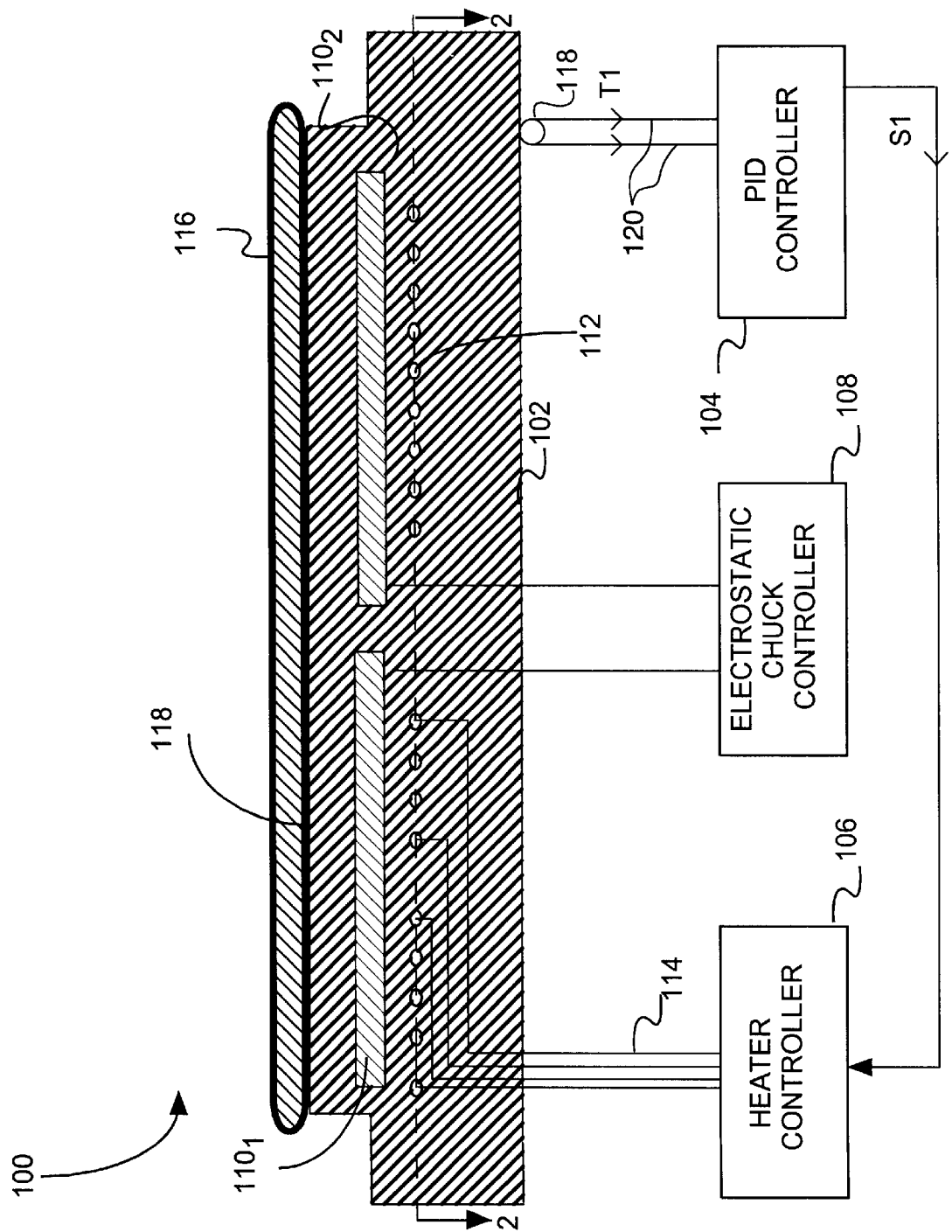
FIG. 1 depicts a cross-sectional view of a ceramic pedestal containing a resistive heater that is connected to a heater controller in accordance with the present invention.
Figure 2:
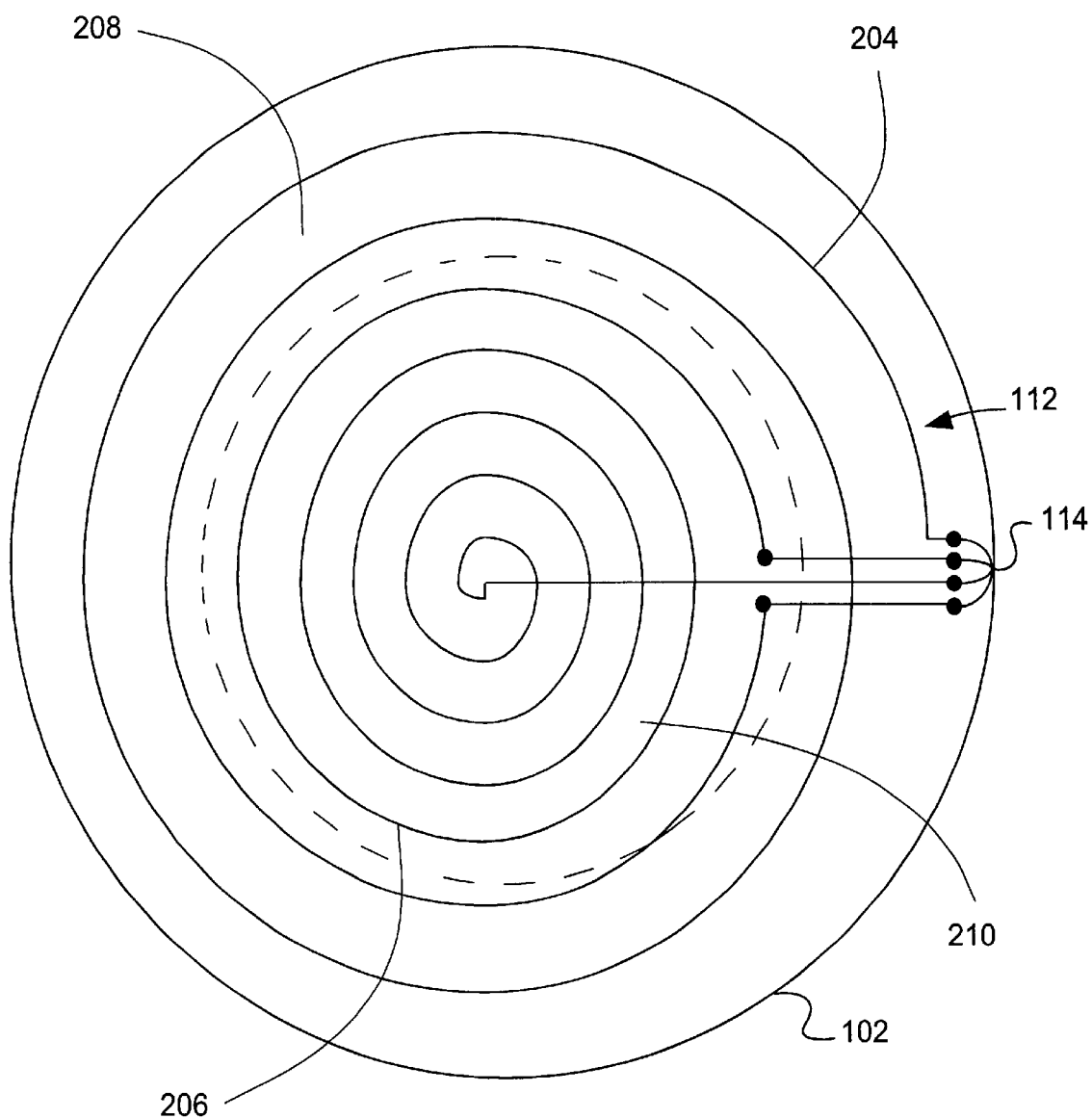
FIG. 2 depicts a top view of the resistive heater as seen along lines 2—2 of FIG. 1.

FIG. 1 depicts a cross-sectional view of a ceramic pedestal assembly 100 which contains a ceramic pedestal 102, connected to a heater controller 106, a temperature controller (PID) 104 and an optional electrostatic chuck controller 108. The pedestal 102 has a top surface 118 upon which a wafer 116 is supported. FIG. 2 depicts a cross-sectional view of the ceramic pedestal 100 taken along line 2—2 of FIG. 1. To best understand the invention the reader should simultaneously refer to FIGS. 1 and 2.

The pedestal assembly 100 contains a resistive heater 112. The heater 112 comprises one or more coils or metallized layers of resistive material such as tungsten for heating one or more zones of pedestal assembly. Preferably there is a coil that corresponds to each zone of the pedestal assembly. When a current is applied to the heater 112 the characteristic resistance of the heater generates heat which, in turn, heats the ceramic surrounding the heater 112 and ultimately the wafer 116 supported by the ceramic pedestal 102. The heater 112 should be interpreted as any type of element whose temperature rises as an electrical signal is applied to the element. The power supplied to the heater 112 is coupled through electrical connectors 114 (i.e., wires) from the heater controller 106. In a preferred embodiment of the invention, the heater 112 has a first coil 204 at an outer zone 208 of the pedestal assembly 100, and a second coil 206 at an inner zone 210 of the pedestal assembly 100. The dashed line depicts the border between the inner and outer zones.

The temperature controller 104 depicted in FIG. 1, monitors the temperature of the pedestal 102 using a thermocouple 118. One or more thermocouple signals $T_1$ transmitted to the temperature controller 104 via connection lines 120. A control signal S1 is generated by the temperature controller 104 in response to the thermocouple signal $T_1$. The signal S1 is generally a voltage in the range of 0 to 10 volts. The specific magnitude of signal S1 indicates the amount of power or current necessary to achieve a desired temperature for the pedestal 102. This value is dynamically adjusted using a conventional PID algorithm to avoid temperature ringing and/or overshoot as the temperature of the pedestal approaches the desired value. In accordance with the present invention, the heater controller 106 processes signal S1 and limits the amount of power or current coupled through wires 114 to the resistive heater 112.

Although the wafer 116 may be clamped to the surface 118 of the pedestal 102 in a variety of ways including a peripheral mechanical clamp, a vacuum clamp, gravity and the like, preferably, an electrostatic chuck facilitates clamping the wafer 116 to the surface 118 of the pedestal 102. Use of an electrostatic chuck facilitates uniform thermal transfer from the wafer to the pedestal as well as improves wafer stability and, reduces particle generation, and the like. This optional electrostatic chuck is drawn in phantom as having coplanar electrodes 1101 and 1102 coupled to an electrostatic chuck controller 108. The electrostatic chuck operates as a bipolar chuck having two coplanar electrodes $110_1$ and $110_2$. The electrostatic chuck controller 108 applies to each electrode an equal and opposite polarity voltage which generates an electric field between the electrodes. This electric field is coupled through the semiconductor wafer 116 such that charges accumulate on the underside of the wafer 116 and opposing charges accumulate on the electrodes $110_1$ and $110_2$ such that an electrostatic force between the charges retains the semiconductor wafer 116 upon the surface 118 of the pedestal 102. Although a bipolar electrostatic chuck is shown, any form of electrostatic chuck could be used with the present invention including a monopolar structure having a single electrode, an interdigital structure having a plurality of electrodes and the like. The chuck can be powered by AC or DC voltage.

Figure 3:
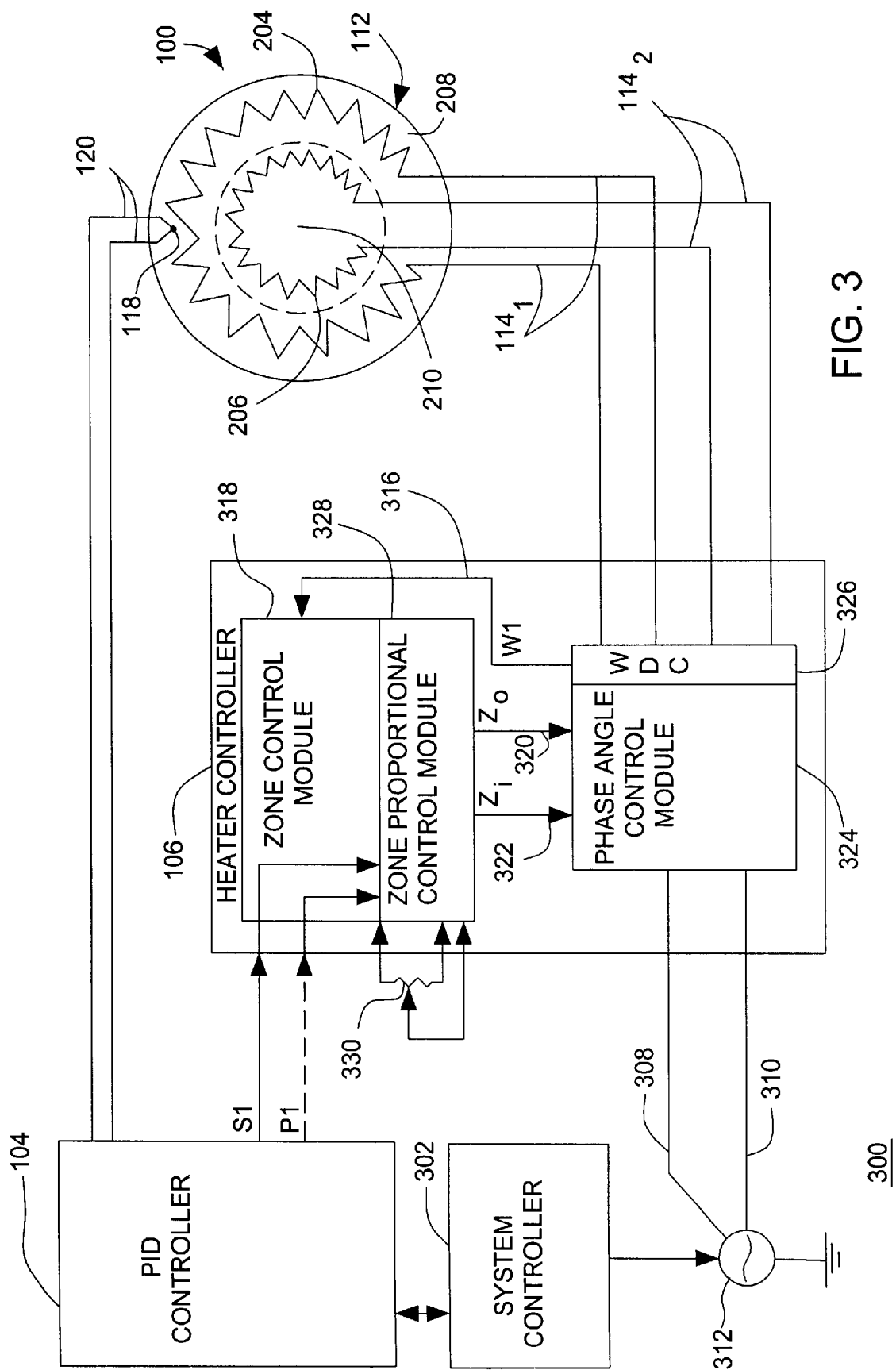
FIG. 3 depicts a schematic view of a system for controlling power and current to a ceramic heater in accordance with the present invention.

FIG. 3 depicts a schematic of a system 300 for controlling the temperature, current and power of the pedestal assembly 100 shown in FIG. 1. The system 300 comprises a system controller 302, the temperature controller 104, the heater controller 106 and pedestal assembly 100. Specifically, system controller 302 is a computer or other similar processing unit that is connected to the temperature controller 104 and heater controller 106 for controlling overall operation of the system. As discussed above, temperature controller 104 is connected to the pedestal assembly 100 via connection lines 120 and thermocouple 118.

The heater controller 106 is likewise connected to the heater 112. Specifically, in the preferred embodiment of the invention there are two heater coils that comprise the heater 112. The first coil 204 heats the outer zone 208 of the pedestal assembly 100 and the second coil 206 heats the inner zone 210 of the pedestal assembly 100. Each coil is connected to a separate set of wires $114_1$ and $114_2$ respectively that are connected to the heater controller 106. Additionally, a power source 312 is connected to the heater controller 106. Preferably, the power source 312 is a 120/200VAC power source capable of delivering at least two phase power to the heater controller 106. Specifically, a first power source line 308 provides a first phase AC power to the heater controller 106 and a second power line 310 provides a second phase power to the heater controller 106.

The heater controller 106 has circuitry for limiting the amount of current and/or power provided to the pedestal assembly, for controlling which zone should be provided with current and/or power, proportional zone control of the current and/or power, phase angle control of power supplied by the power source 312, and detection of faulty or improperly connected wires from the heater controller 106 to the heater 112. Specifically, a zone control module 318 receives the control signal S1 from the temperature controller 104. The zone control module 318 then makes a determination as to how much power is to be provided to the heater 112. For example, for initiation of a new process routine, control signal S1 would carry information indicating that a full power startup of the heater is required. As such the zone control module 318 would provide an outer zone control line 320 and an inner zone control line 322 with zone control signals $Z_o+Z_i$ respectively to provide sufficient power and current to the pedestal assembly 100 to raise its temperature to a desired initial operating temperature (i.e., 550° C.). The signals $Z_i+Z_o$, provided along the inner zone control line 322 and outer zone control line 320 are passed along to a phase angle control module 324. The phase angle control 324 contains the necessary circuitry to change the duration of firing angle control signals and hence the voltage, current and power that is eventually provided to wires 114. A complete description of a suitable phase angle control signal module and internal circuitry is seen and described in commonly assigned patent application Ser. No. 08/965,369 filed Nov. 6, 1997. Although that circuitry and specific phase angle controller is described for use in a single coil heater, the controller can be adapted to control any number of coils within the heater and particularly the two coils 204 and 206 as seen and described in the present invention. After phase angle control signal processing is performed, the appropriate current, voltage and power is provided to the heater 112 via wires $114_1$ and $114_2$.

Additionally, the heater controller 106 has a wire detection circuit (WDC) 326. The wire detection circuit 326 is connected to the phase angle control module 324 and to the zone control module 318 via warning control line 316. The wiring detection circuit 326 contains the necessary circuitry to evaluate the status of the wires $114_2$ and $114_2$ to ensure that they have been properly connected to inner zone coil 206 and outer zone coil 204 of the heater 112. As such, the system 300 is capable of detecting faulty or a broken connections between the heater controller 106 and the heater 112. Additionally, the system 300 can detect if there is a sudden loss of power in any one or all of the zones as power is provided to the heater 112 from the controller 106 or if power is being applied to one or more of the zones when not requested (i.e., as the result of a short circuit). Should the wiring detection circuit 326 determine that there is a no power, short, open or otherwise faulty circuit, or inverted zone connection condition between the controller 106 and the heater 112 a warning signal W1 is provided to the zone control module 318 from the wiring detection circuit 326 along warning control line 316. Accordingly, the zone control module 318 will shut down all power to the heater 112 to prevent damage thereto.

Additionally, the zone control module 318 contains an additional component to proportionally control the amount of power and current provided to each of the zones. Specifically, zone proportional control module 328 contains the necessary circuitry to alter the power provided to one zone with respect to another zone. In a preferred embodiment of the invention, the zone proportion control module 328 provides 100% of the output power of the heater controller 106 to the outer coil 204 and proportionally steps down the power provided to the inner coil 206 with respect to the outer coil 204. Such control is set, maintained and altered as necessary by potentiometer 330. Potentiometer 330 can be controlled in a variety of means consisting of but not limited to manual control (via a dial or other similar control) or via control through the system controller 302. In operation, the heater heats the pedestal assembly 100 to the desired initial temperature as a result of control signal S1 providing full power to the inner and outer zones, 210 and 208 respectively while temperature readings are provided to the temperature controller 104 by thermocouple 118 and connector lines 120. At the appropriate time, temperature controller 104 provides a setpoint signal P1 to the heater controller 106. The heater controller 106 processes the setpoint signal P1 in the zone proportion control module 328 to step down the power provided to the inner zone according to the potentiometer 330 setting. That is, setpoint signal PI reduces the current and power signals provided at line 322 for the inner coil 206 with respect to the current and power signals provided at line 320 for the outer coil 204.

Figure 4:
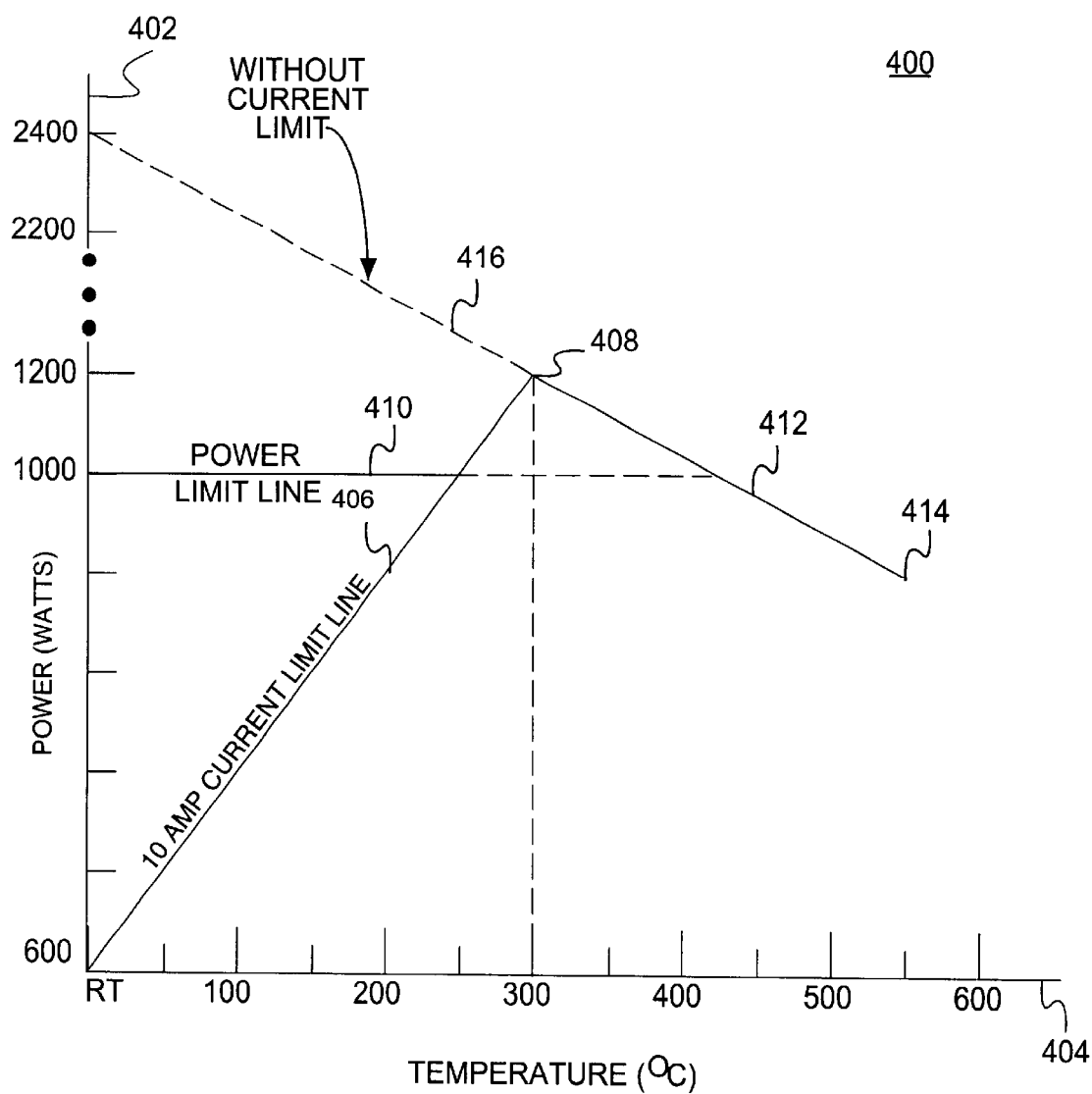
FIG. 4 depicts a graph of power vs. temperature for a resistive heater that is controlled in accordance with the present invention.

FIG. 4 depicts a graph 400 of power (axis 402) versus temperature (axis 404) as produced by the present invention. Consequently, using the present invention with a limit of 10 amperes causes the power level to rise (along path 406) to a maximum of, e.g., 1200 watts, relatively linearly as the resistance of the heater element increases with temperature and the current is limited at 10 amperes. During this portion of the curve, the signal S1 is at a maximum value. The apex 408 of the curve 400 occurs at about 300° C. Once the power attains the 1200 watt level, the resistance of the heater continues to increase and the current falls below the 10 ampere limit such that the curve along portion 412 linearly declines from point 408 to point 414 where a nominal temperature of 550° C. is attained and the heater consumes about 800 watts.

Rather than limit the current applied to the heater, the total power delivered to the heater is limited at, e.g., 1000 watts. As such, as the resistance of the heater changes, with respect to the heater resistance the current control input is varied in an inverse relationship such that the power is maintained at a constant value (e.g., 1000 watts). As depicted in FIG. 4, such a power limit provides a flat portion 410 of the curve 400. As such, the power curve is flat along portion 410 for all temperatures below approximately 400° C. and declines along portion 412 before reaching the nominal power consumption of approximately 800 watts at point 414. Such a power limitation insures that the thermal gradients within the ceramic pedestal are insufficient to cause any physical damage to the pedestal.

Figure 6:
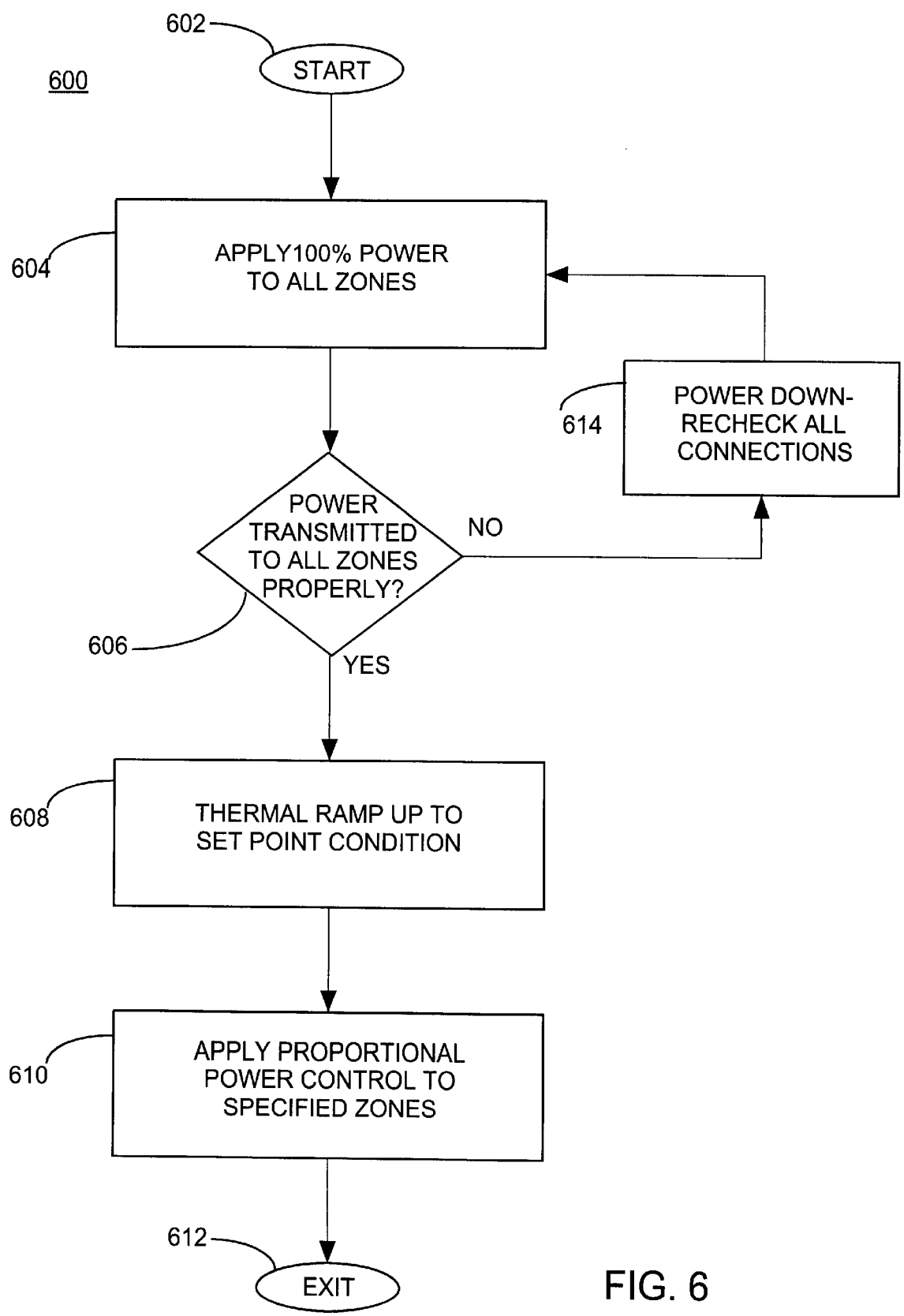
FIG. 6 depicts a series of steps of a method for controlling power and current in accordance with the present invention.

The present invention also includes a method for controlling power to a ceramic pedestal assembly. FIG. 6 depicts a method in accordance with the present invention for controlling power to a pedestal assembly such as pedestal assembly 100 seen and described above. One or more zones are provided in the pedestal assembly to which proportional power control is provided to achieve the necessary temperature profile for system processing (i.e., heating a semiconductor wafer that is disposed upon a pedestal assembly for carrying out physical vapor deposition). Specifically, the method 600 is a series of steps starting with step 602. At step 604, 100% power required to heat the pedestal assembly to the desired temperature is provided to all zones. For example, a desired power rating would be approximately in the range of 800 to 1200 watts. In step 606, a decision step is executed wherein the power that is to be provided to all zones is checked for a proper polarity, orientation, failure of connection or the like. If power is properly provided to all zones, step 608 is executed wherein the power provided to the pedestal assembly causes thermal ramp up to a predetermined setpoint. Once the setpoint is reached, step 610 is executed wherein proportional power control to at least one of the zones within the pedestal assembly is provided. Specifically, and in a preferred embodiment of the invention, at step 604, 100% power is applied to two zones and at step 610, 100% power is applied to one of the zones (i.e., an outer zone) of the pedestal assembly and 50% power is applied to a second zone (i.e., an inner zone) of the pedestal assembly.

If it is determined that power is not being properly transmitted in all zones in accordance with step 606, then step 614 is executed wherein a powerdown is executed and all connections are checked for proper orientation or physical condition (i.e., shorting or open circuit condition). The powerdown is preferably an automatic disconnection of a power source from the pedestal assembly. The recheck is preferably a direct action executed by a system operator (not shown) which may entail repair or replacement of one or more connections. Once the powerdown and recheck of step 614 is executed and the necessary corrections are made, the method returns to step 604 wherein 100% power is then again applied to all zones. The method ends at step 612.

With the method as described above, it is possible to achieve proportional control of the pedestal assembly heater so that thermal gradients during critical operations can be controlled and/or compensated for. This enhanced control reduces the likelihood of degradation or cracking of the ceramic heater. And/or improper use or connection of the heater to a heater controller. As such, ceramic heater lifetime is enhanced and process conditions are more easily controlled thereby reducing the likelihood of process anomalies which may reduce process yield or end results. A typical condition which may cause step 606 to indicate a no response would be the inadvertent incomplete connection of an inner or outer heater connection to the heater controller, or an interchanging of the wires between inner and outer heater connection ports on the heater controller 106. Other situations which may indicate a no response on step 606 is if a wire failed (shorted or open circuited) or if a power source connected to the heater controller were to fail or partially fail.

Figure 5:
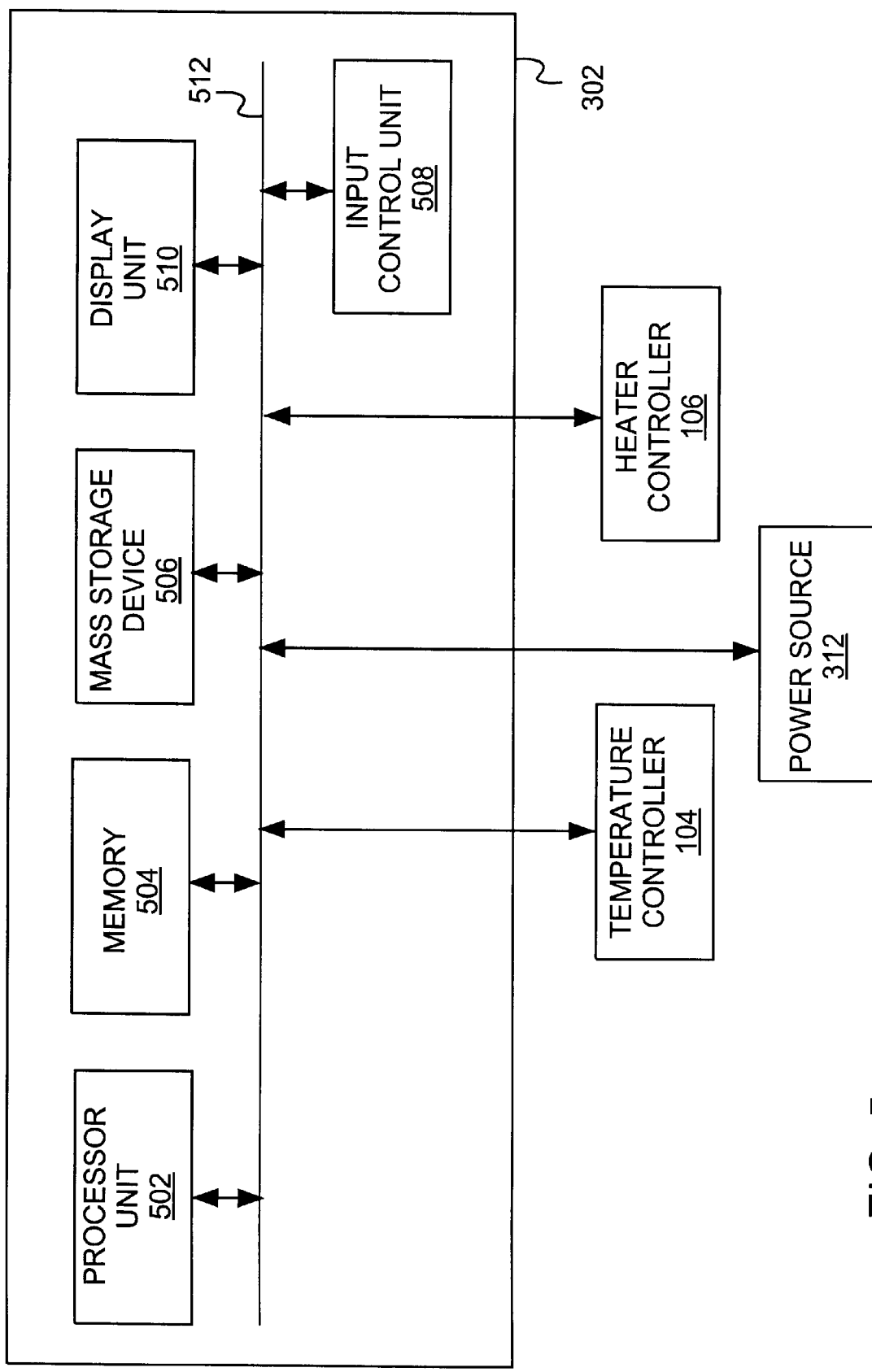
FIG. 5 depicts a detailed view of a system controller for controlling the system of the subject invention.

The above-described apparatus and process can be performed in a system 300 that is controlled by a processor based system controller 302 as seen in FIG. 3. FIG. 5 shows a block diagram of the system 300 for controlling pedestal assembly functions, such as temperature, current and power having such a system controller 302 that can be employed in such a capacity. The system controller 302 includes a processor unit 502, a memory 504, a mass storage device 506, an input control unit 508, and a display unit 510 which are all coupled to a control system bus 512.

The processor unit 502 forms a general purpose computer that becomes a specific purpose computer when executing programs such as a program for controlling pedestal assembly functions of the present invention. Although the invention is described herein as being implemented in software and executed upon a general purpose computer, those skilled in the art will realize that the present invention could be operated using hardware such as an application specific integrated circuit ASIC or other hardware circuitry. As such, the invention should be understood as being able to be implemented, in whole or in part, in software, hardware or both.

The processor unit 502 is either a microprocessor or other engine that is capable of executing instructions stored in a memory. The memory 504 can be comprised of a hard disk drive, random access memory ("RAM"), read only memory ("ROM"), a combination of RAM and ROM, or another processor readable storage medium. The memory 504 contains instructions that the processor unit 502 executes to facilitate the performance of the system 300. The instructions in the memory 504 are in the form of program code. The program code may conform to any one of a number of different programming languages. For example, the program code can be written in C+, C++, BASIC, Pascal, or a number of other languages.

The mass storage device 506 stores data and instructions and retrieves data and program code instructions from a processor readable storage medium, such as a magnetic disk or magnetic tape. For example, the mass storage device 506 can be a hard disk drive, floppy disk drive, tape drive, or optical disk drive. The mass storage device 506 stores and retrieves the instructions in response to directions that it receives from the processor unit 502. Data and program code instructions that are stored and retrieved by the mass storage device 506 are employed by the processor unit 502 for operating the system 300. The data and program code instructions are first retrieved by the mass storage device 506 from a medium and then transferred to the memory 504 for use by the processor unit 502.

The display unit 510 provides information to a system operator in the form of graphical displays and alphanumeric characters under control of the processor unit 502. The input control unit 508 couples a data input device, such as a keyboard, mouse, or light pen, to the processor unit 502 to provide for the receipt of a chamber operator's inputs.

The control system bus 512 provides for the transfer of data and control signals between all of the devices that are coupled to the control system bus 512. Although the control system bus 512 is displayed as a single bus that directly connects the devices in the processor unit 502, the control system bus 512 can also be a collection of busses. For example, the display unit 510, input control unit 508 and mass storage device 506 can be coupled to an input-output peripheral bus, while the processor unit 502 and memory 504 are coupled to a local processor bus. The local processor bus and input-output peripheral bus are coupled together to form the control system bus 512.

The system controller 302 is coupled to the elements of the system 300, to assist in the execution of semiconductor wafer processing and specifically heater control in accordance with the present invention. Each of these elements is coupled to the control system bus 512 to facilitate communication between the system controller 302 and the elements. These elements include but are not limited to the temperature controller 104, the heater controller 106 and the power supply 312. The system controller 302 provides signals to the system elements that cause these elements to perform operations for controller heater temperature during various times of wafer processing.

In operation, the processor unit 502 directs the operation of the system elements in response to the program code instructions that it retrieves from the memory 504. For example, once a wafer is placed on the pedestal assembly 100, the processor unit 502 executes instructions retrieved from the memory 504 such as activating the heating element 112 at full power, at proportional control mode, power line connection check and the like. The execution of these instructions results in the elements of the system 300 being operated to control the heater 112 and subsequently process a wafer.

There has thus been shown and described a novel method and apparatus for controlling the thermal gradients within a ceramic pedestal that is heated by a resistive heater. Many changes, modifications, variations and other uses and applications of this subject invention will however become apparent to those skilled in the art after considering this specification and accompanying drawings which disclose the embodiments thereof. All such changes, modifications, variations and other uses and applications which do not depart from the spirit and scope of the invention are deemed to be covered by the invention, which is to be limited only by the claims which follow.

What is claimed is:

1. Apparatus for controlling thermal gradients generated within more than one zone of a substrate support pedestal in a semiconductor process system comprising:
a heater controller connected to said pedestal wherein said heater controller further comprises a zone control module and a zone proportional control module.

2. The apparatus of claim 1 wherein said pedestal further comprises a resistive heater having more than one coil, each of said more than one zone corresponding to said more than one coil.

3. The apparatus of claim 2 wherein the zone control module controls the amount of power provided to said more than one coil.

4. The apparatus of claim 1 wherein the heater controller further comprises a phase angle control module connected to the zone control module.

5. The apparatus of claim 2 wherein the heater controller further comprises a wire detection circuit connected to the zone control module.

6. The apparatus of claim 5 wherein the wire detection circuit evaluates the status of one or more connections between the heater controller and the heater.

7. The apparatus of claim 6, wherein said status of said one or more connections is selected from the group consisting of all connections properly connected to all coils, one or more connections inverted with respect to the coils, one or more connections not transmitting power from the heater controller to one or more coils, one or more connections transmitting power from the heater controller to one or more coils at an inappropriate time, one or more connections short-circuited and one or more connections open-circuited.

8. The apparatus of claim 1 wherein the substrate support pedestal is a ceramic pedestal and each of said more than one zone has a resistive heater.

9. A method of reducing thermal gradients within a substrate support pedestal in a semiconductor process system having more than one zone, the method comprising the steps of:

(a) applying an equal amount of power to all of said zones for uniform thermal ramp up of said substrate support pedestal;

(b) performing a check of power levels transmitted to said zones;

(c) allowing thermal ramp up of the substrate support pedestal to reach a predetermined set point; and (d) upon reaching said set point, maintaining the original amount of power to one of said zones and applying proportionately less power to at least one of the remaining said zones.

10. The method of claim 9 wherein step (a) further comprises applying 100% of the power produced by a heater controller connected to said substrate support pedestal.

11. The method of claim 10 wherein step (b) further comprises determining if an electrical connection between said substrate support pedestal and said heater controller is properly connected.

12. The method of claim 11 wherein if said electrical connector is not properly connected, a powerdown and recheck of said connector is performed.

13. The method of claim 9 wherein step (c) further comprises raising the temperature of the substrate support pedestal to a temperature of approximately 550° C.

14. The method of claim 10 wherein step (d) further comprises applying 100% power to a first outer zone of the substrate support pedestal and applying 50% of said power to a second inner zone of said substrate support pedestal.

15. The method of claim 9 wherein said substrate support pedestal is a ceramic electrostatic chuck.

16. In a system for controlling a substrate support having more than one temperature controllable zones, a computer readable medium in a general purpose computer system that operates as a special purpose controller when executing a zoned temperature control program for said substrate support to perform a process comprising the steps of:

(a) applying an equal amount of power to all of said zones for uniform thermal ramp up of said substrate support;

(b) performing a check of power levels transmitted to said zones;

(c) allowing thermal ramp up of the substrate support to reach a predetermined set point; and (d) upon reaching said set point, maintaining the original amount of power to one of said zones and applying proportionately less power to at least one of the remaining said zones.

* * * * *

UNITED STATES PATENT AND TRADEMARK OFFICE
CERTIFICATE OF CORRECTION

PATENT NO.     : 6,469,283 B1
DATED          : October 22, 2002
INVENTOR(S)    : Vincent E. Berkhart et al.

It is certified that error appears in the above-identified patent and that said Letters Patent is hereby corrected as shown below:

Title page,
Item [75], Inventors, please change "Anthony Chan" to -- To Chan --.
Item [56], References Cited, U.S. PATENT DOCUMENTS, please add:
-- 4,909,314 A   3/1990       Lamont, Jr.     165/80.3
   5,228,501 A   7/1993       Tepman et al.   165/80.1 --.

Column 3,
Line 49, please change "1101 and 1102" to -- $110_1$ and $110_2$ --.

Signed and Sealed this

Fourth Day of November, 2003

JAMES E. ROGAN
*Director of the United States Patent and Trademark Office*